United States Patent
Kataoka et al.

(10) Patent No.: US 9,793,920 B1
(45) Date of Patent: Oct. 17, 2017

(54) COMPUTER-READABLE RECORDING MEDIUM, ENCODING DEVICE, AND ENCODING METHOD

(71) Applicant: FUJITSU LIMITED, Kawasaki-shi, Kanagawa (JP)

(72) Inventors: Masahiro Kataoka, Kamakura (JP); Ryo Matsumura, Numazu (JP); Hazuki Abe, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/489,029

(22) Filed: Apr. 17, 2017

(30) Foreign Application Priority Data

Apr. 19, 2016 (JP) ................. 2016-083964

(51) Int. Cl.
*H03M 7/34* (2006.01)
*H03M 7/30* (2006.01)
*G06F 17/22* (2006.01)

(52) U.S. Cl.
CPC ...... *H03M 7/3088* (2013.01); *G06F 17/2205* (2013.01)

(58) Field of Classification Search
CPC .............. H03M 7/3084; H03M 7/3088; G06F 17/2205; G06F 17/2217; G06F 17/2735; G06F 17/30097; G06F 17/30613; G06F 17/30109; G06F 17/30628; G06F 17/30106
USPC ...................................... 341/50, 51
See application file for complete search history.

(56) References Cited

U.S. PATENT DOCUMENTS

| | | | | |
|---|---|---|---|---|
| 5,850,565 A * | 12/1998 | Wightman | .......... | H03M 7/3084 710/1 |
| 5,872,530 A * | 2/1999 | Domyo | ............... | H03M 7/3088 341/106 |
| 5,951,623 A * | 9/1999 | Reynar | ................... | G06T 9/005 341/106 |
| 7,598,891 B2 | 10/2009 | Ono et al. | | |
| 7,982,636 B2 * | 7/2011 | Abali | .................. | H03M 7/3088 341/51 |

(Continued)

FOREIGN PATENT DOCUMENTS

| | | |
|---|---|---|
| JP | 9-214352 | 8/1997 |
| JP | 2008-278258 | 11/2008 |
| WO | WO 2013/038527 A1 | 3/2013 |

OTHER PUBLICATIONS

Keisuke Nishida, "Technology underlining Google", The inner world of giant system, WEN+DB Press plus series, 2008, 24 pgs., (with English translation).

(Continued)

*Primary Examiner* — Jean B Jeanglaude
(74) *Attorney, Agent, or Firm* — Oblon, McClelland, Maier & Neustadt, L.L.P.

(57) ABSTRACT

The encoding device 100 extracts, when encoding a target file by using a static dictionary unit 121 and a dynamic dictionary unit 122, a registered word included in an external dictionary unit 221 from among words registered in the dynamic dictionary unit 122, in which the external dictionary associates a specific word group and a code group with each other; and registers, in the dynamic dictionary unit 122, a code of the registered word in the external dictionary unit 221 and a dynamic code assigned dynamically in association with each other.

4 Claims, 12 Drawing Sheets

(56) References Cited

U.S. PATENT DOCUMENTS

| | | | |
|---|---|---|---|
| 8,200,641 B2* | 6/2012 | Jayaraman | G06F 17/30156 341/51 |
| 8,872,677 B2* | 10/2014 | Litvak | H03M 7/3084 341/106 |
| 2014/0229484 A1 | 8/2014 | Kataoka et al. | |

OTHER PUBLICATIONS

Sekiguchi Koji, "Introduction to Apache Lucene", Constructing Java open source full-text search system, 2006, 49 pgs., (with English translation).

* cited by examiner

FIG.3
DYNAMIC
DICTIO-
NARY
D0
BUFFERING UNIT D1
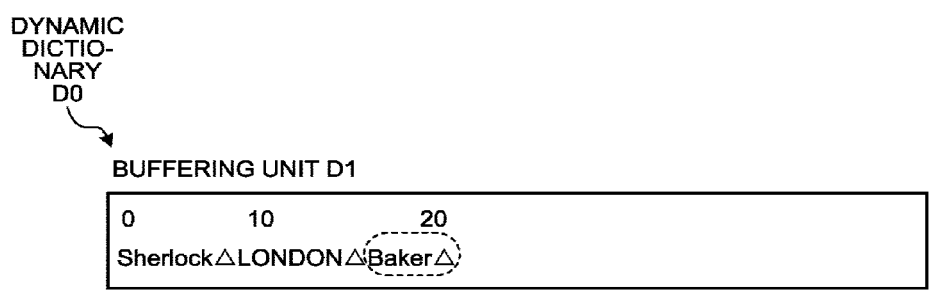
ADDRESS TABLE D2
| DYNAMIC CODE | STORAGE POSITION | DATA LENGTH | EXTERNAL DICTIONARY ID | WORD CODE |
|---|---|---|---|---|
| A000h | 0 | 9 | 31 | CE0003h |
| A001h | 9 | 7 | 22 | CC0977h |
| A002h | 16 | 6 | 53 | CD0009h |
| A003h | 22 | | | |
| ⋮ | | | | |
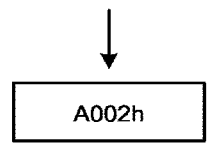

COMPUTER-READABLE RECORDING MEDIUM, ENCODING DEVICE, AND ENCODING METHOD

CROSS-REFERENCE TO RELATED APPLICATION(S)

This application is based upon and claims the benefit of priority of the prior Japanese Patent Application No. 2016-083964, filed on Apr. 19, 2016, the entire contents of which are incorporated herein by reference.

FIELD

The embodiments discussed herein are related to a computer-readable recording medium, an encoding device, and an encoding method.

BACKGROUND

In compression of a single file, encoding is performed using a static dictionary corresponding to high-frequency words and a dynamic dictionary generated corresponding to words not included in the static dictionary and further appearing a plurality of times in this file (for example, see Japanese Laid-open Patent Publication No. 09-214352). The static dictionary mentioned here is a dictionary that associates codes with high-frequency words in a file group or data as a population, and the dynamic dictionary is a dictionary that associates codes with words appearing a plurality of times in data to be compressed.

There is known a technology that generates index information indicating, when compressing a plurality of files, which of the files includes predetermined character information (for example, see International Publication Pamphlet No. W/O 2013/038527). The index information is used as an index indicating whether or not each of the plurality of files includes character information to be retrieved. The character information means character strings in which, for example, one-gram character codes are concatenated.

On the other hand, there is known a technology that generates pointer table-type index information associated with words (for example, see NISHIDA KESUKE: "Google wo sasaeru gijutsu", Apr. 25, 2008, KUBAUHIKI KAISHA GIJUTSU HYOURONSHA). This technology will be explained with reference to FIG. 1. FIG. 1 is a diagram illustrating a reference example of a pointer table-type index generating process. As illustrated in FIG. 1, this technology extracts words from each document file, generates index information associated with a corresponding document ID, word IDs, and appearance positions thereof, collects pieces of the index information, and sorts the collected pieces of index information on the basis of the word IDs. Thus, a transposition index, namely, pointer table-type index information, is generated, which associates the document IDs and the appearance positions with each other on the basis of the word IDs.

Patent Literature 2: Japanese Laid-open Patent Publication No. 2008-278258
Non-Patent Literature 2: SEKIGUCHI KOJI: "ApacheLucene nyumon", Jun. 25, 2006, KUBAUHIKI KAISHA GIJUTSU HYOURONSHA However, the conventional technology has a problem that, when there exists a word to be registered in the dynamic dictionary, index information is not able to be easily generated, which indicates which of the plurality of files includes this word. On the other hand, from another viewpoint, there exists a problem that, when a word to be registered in the dynamic dictionary exists, index information indicating which of the plurality of files includes this word is not able to be easily distributed and generated to a plurality of small-scale systems.

For example, when compressing a plurality of files, index information can be generated with respect to words included in the static dictionary. On the contrary, when the codes in the respective files are different from each other with respect to a word registered in the dynamic dictionary, index information on all of the plurality of files are not able to be easily generated.

The index information generated by the conventional technology is index information on character information, and basically is not index information on words. Moreover, the static dictionary does not include any word referred to as a new word or a vogue word. Therefore, the conventional technology that generates the index information is not able to easily generate index information indicating which of the plurality of files includes this word.

On the other hand, because words included in one document file differ from words included in another document file, the conventional technology that generates the pointer table-type index information associated with words is not able to easily generate a pointer table-type index based on word IDs of words included in a plurality of document files. Moreover, because an updated or added document file can include a new word, a vogue word, etc. in some cases, a collection process, a sort process, and a transposition process of the index information are repeated again. Thus, this conventional technology needs a huge resource for the collection and transposition processes of the index information, so that it is impossible to easily distribute and generate the index information to small-scale resources.

SUMMARY

According to an aspect of an embodiment, a non-transitory computer readable recording medium stores therein an encoding program. The program causes a computer to execute a process. The process includes extracting a registered word from a plurality of first words registered in a dynamic dictionary when encoding a target file with a static dictionary and the dynamic dictionary, the registered word being included in an external dictionary and registered in the dynamic dictionary, the external dictionary associating respective word in a specific word group and respective code in a code group, the plurality of first words in the dynamic dictionary being not registered in the static dictionary. The process includes associating a corresponding code and a dynamic code of the registered word in the dynamic dictionary, the corresponding code being associated with the registered word in the external dictionary, the dynamic code being associated with the registered word in the dynamic dictionary.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3 is a diagram illustrating one example of a dynamic dictionary according to the first embodiment;

DESCRIPTION OF EMBODIMENTS

Preferred embodiments of the present invention will be explained with reference to accompanying drawings. In addition, the disclosed technology is not limited to the embodiments described below.

[a] First Embodiment

Generating Process of Bitmap-Type Index

Figure 1:
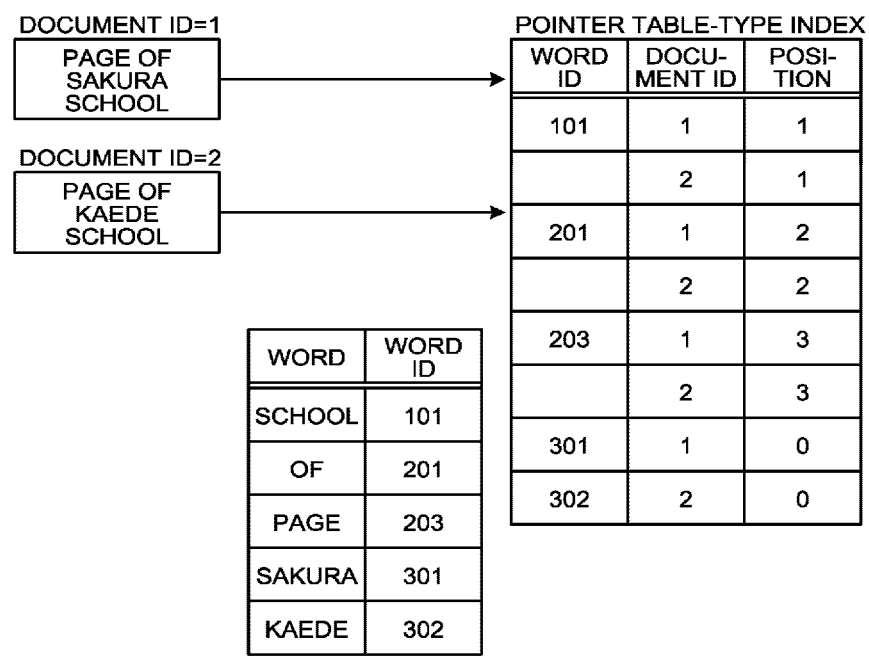
FIG. 1 is a diagram illustrating a reference example of a pointer table-type index generating process.
Figure 2:
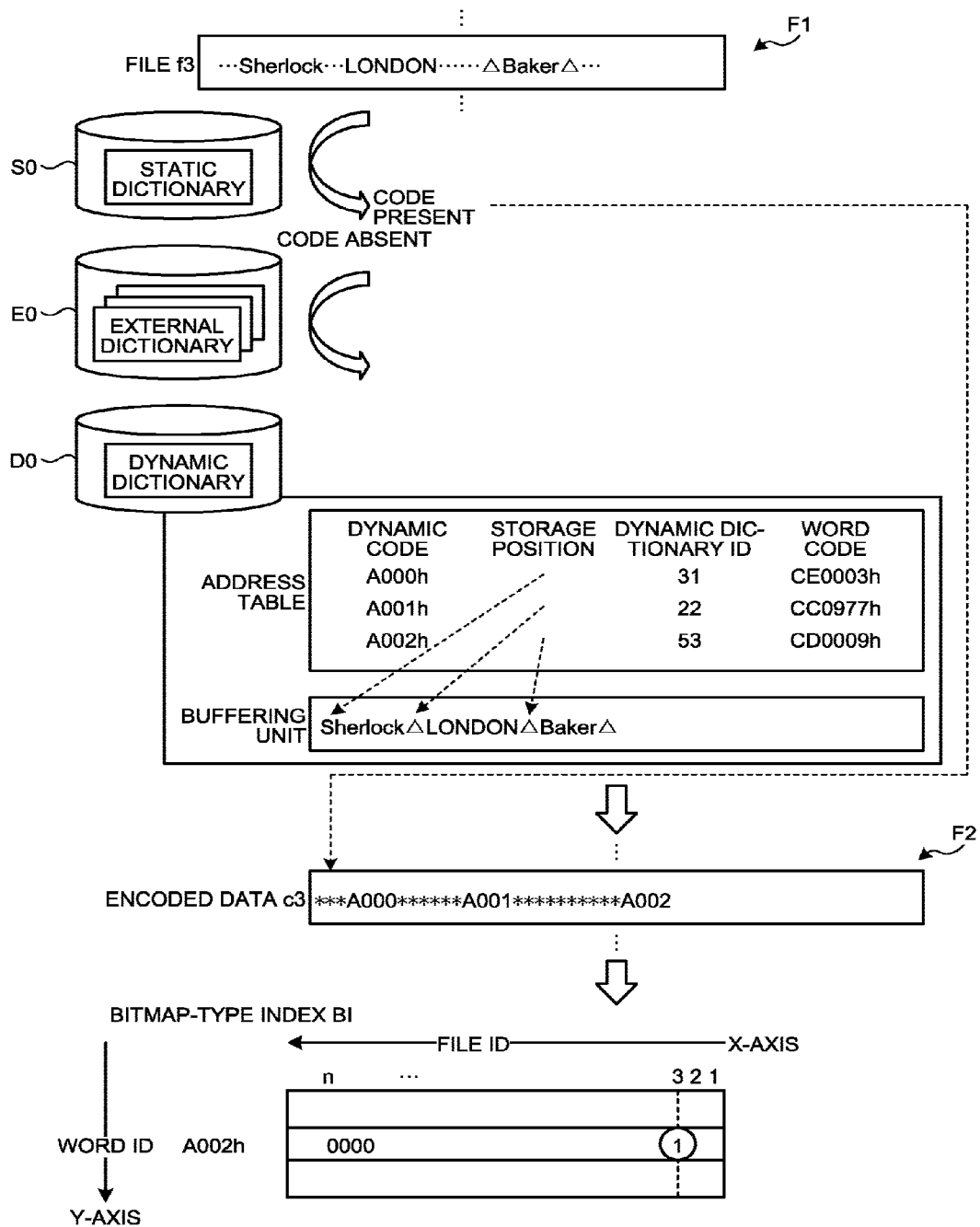
FIG. 2 is a diagram illustrating one example of a flow of a bitmap-type index generating process according to a first embodiment.

FIG. 2 is a diagram illustrating one example of a flow of a bitmap-type index generating process according to a first embodiment. As illustrated in FIG. 2, when encoding words included in a specific file with a static dictionary S0 and a dynamic dictionary D0, an encoding device extracts a word included in an external dictionary E0 among words not included in the static dictionary S0. The extracted word is a registered word being included in the external dictionary E0 and registered in the dynamic dictionary D0. The encoding device associates a corresponding code and a dynamic code of the registered word in the dynamic dictionary D0. The corresponding code is associated with the registered word in the external dictionary E0, the dynamic code is associated with the registered word in the dynamic dictionary D0. Thus, the encoding device associates the dynamic code of the registered word that is registered in the dynamic dictionary D0 and the corresponding code of the external dictionary E0 when a specific file is encoded, and thus the corresponding code can be used in common in a plurality of files. As a result, the encoding device can easily generate a bitmap-type index of words in each of the plurality of files.

The static dictionary S0 mentioned here is a dictionary in which the appearance frequency of a word appearing in a document is specified on the basis of general English-language dictionaries, general Japanese-language dictionaries, general textbooks, etc., and a shorter code is assigned to a word whose appearance frequency is higher. In the static dictionary S0, static codes are preliminary registered, which are codes corresponding to respective words.

The dynamic dictionary D0 mentioned here associates a word not registered in the static dictionary S0 but registered in the external dictionary E0, a code in the external dictionary E0, and a dynamic code assigned dynamically with one another. Words not registered in the static dictionary S0 include, as an example, a word (low frequency word) whose appearance frequency is low. This word (low frequency word) may be a specialized word, a new word, an unknown word, etc. The specialized word mentioned here is a word that is available in a specific area of learning, a specific business field, etc., and has a feature of repeatedly appearing in a document to be encoded. The new word is a newly made word such as a vogue word, and has a feature of repeatedly appearing in a document to be encoded. An unknown word is a word that is neither the specialized word nor the new word, and has a feature of repeatedly appearing in a document to be encoded. In a buffering unit of the dynamic dictionary D0, in accordance with the appearance order of words not registered in the static dictionary S0, the words associated with respective dynamic codes are registered. Detailed explanation of the dynamic dictionary D0 will be mentioned later.

The external dictionary E0 mentioned here is, for example, a common dictionary that associates words and respective codes with each other, which is, for example, a dictionary that associates words not registered in the static dictionary S0 and respective word codes with each other for each specialty. The external dictionary E0 includes, as an example, specialized dictionaries, new-word dictionaries, unknown-word dictionaries, etc. The specialized dictionary memorizes specialized words. The new-word dictionary memorizes new words. The unknown-word dictionary memorizes unknown words. The dynamic code to be assigned to a low frequency word differs for each file to be encoded even in a case of the same word. A word code in the external dictionary E0 is, in a case of the same word, for example, shared between files to be encoded and shared in a plurality of encoding operations.

Hereinafter, one example of an encoding process of the encoding device will be explained. For example, the encoding device loads a file f3 to be encoded on a memory region. Herein, "3" of the file f3 indicates that a file ID is "3".

The encoding device reads out the file f3 to be encoded from the memory region, and executes lexical analysis on the read out file f3. The lexical analysis mentioned here is dividing a file in a state not encoded into words.

The encoding device compares the static dictionary S0 with a character string of the word to determine whether or not there exists a code corresponding to the character string of the word in the static dictionary S0. This determination process may compare a bit filter that specifies a character string of a word that can be encoded by using the static dictionary S0 with the character string of the word to determine whether or not the character string of the word is hit in the bit filter. The bit filter mentioned here is a filter that specifies a character string of a word that can be encoded by using the static dictionary S0. When there exists a code corresponding to a character string of a word in the static dictionary S0, the encoding device encodes the character string of the word into a code (static code) corresponding to the character string of this word on the basis of the static dictionary S0, and outputs the static code.

When there exists no code corresponding to the character string of the word in the static dictionary S0, the encoding device acquires, from the external dictionary E0, a code (word code) corresponding to the character string of the word and an ID of the external dictionary E0 where this word is registered. The encoding device may assign a code in the external dictionary E0 by using the own device, or may inquire a master device that assigns word codes. In the embodiment, the case in which the encoding device inquires a master device about a code in the external dictionary E0 will be explained.

The encoding device registers, in the dynamic dictionary D0, a character string of a word, a code (word code) in the external dictionary E0, and a dynamic code assigned dynamically. The encoding device encodes, on the basis of the dynamic dictionary D0, the registered character string of the word into a word code corresponding to this registered character string of the word, and outputs this word code. When the character string of the word is registered in the dynamic dictionary D0, the encoding device may encode the character string of this word into a word code corresponding to the character string of this word on the basis of the dynamic dictionary D0, and may output this word code.

The encoding device outputs the word codes based on the static codes and the dynamic dictionary D0 to an area of encoded data c3 in the appearance order of the words. The area of encoded data c3 is an area of encoded data in an encoded file, which corresponds to the file f3.

The encoding device sets, for a bitmap-type index BI, presence/absence of each of the plurality of word codes in the file f3.

The bitmap-type index BI mentioned here is an index for full-text retrieval, and is bit strings in which pointers specifying respective words and bits indicating presence/absence of the words in each target file are connected. Namely, the bitmap-type index BI is a bitmap in which presence/absence of words included in a file is indexed for each file. In a retrieval process, this bitmap can be used as an index that indicates whether or not a word to be retrieved is included in accordance with ON•OFF of a bit. For example, a code of a word is employed as a pointer that specifies the word. A code of a word is a static code or a word code, and is the same meaning as a word ID. For example, a word may be used in itself as the pointer that specifies the word. Namely, the bitmap-type index BI is collected bitmaps of words to be indicated by using respective pointers that specify the words. As illustrated in FIG. 2, the X-axis of the bitmap-type index BI indicates file IDs, and the Y-axis of the bitmap-type index BI indicates the word IDs. In other words, the bitmap-type index BI indicates presence/absence of words indicated by respective word IDs for each of the files indicated by a plurality of file IDs.

As one example, a bitmap corresponding to a word ID "A002h" of "Baker" is illustrated. When a word "Baker" indicated by the word ID "A002h" exists in a file, "ON", namely "1" in binary is set as presence/absence of the file of this word, and when this word does not exist in the file, "OFF", namely "0" in binary is set as presence/absence of the file of this word. Herein, because the word "Baker" exists in the file f3, "1" is set for a bit corresponding to a file ID "3" in a bitmap corresponding to the word ID "A002h" of "Baker".

One Example of Dynamic Dictionary

FIG. 3 is a diagram illustrating one example of a dynamic dictionary according to the first embodiment. The dynamic dictionary D0 illustrated in FIG. 3 includes a buffering unit D1 and an address table D2. The buffering unit D1 memorizes character strings. The address table D2 holds dynamic codes, storage positions, data lengths, external dictionary IDs, and word codes in association with one another. The dynamic codes are preliminary-fixed length codes that are to be assigned in the order that the character strings of the words are registered. Herein, the dynamic code is a code of fixed length of three bytes, which starts from hexadecimal "F". The storage position indicates a stored position of a character string in the buffering unit D1. The data length indicates the length (byte length) of a character string stored in the buffering unit D1. The external dictionary ID indicates an ID of the external dictionary in which the word is registered. The word code is a code assigned to a word, and is, for example, a compression code. Even when the word is registered in the dynamic dictionary D0, this word code is used in a plurality of files in common as long as the word code corresponds to the same word.

For example, the case in which a dynamic code is assigned to a character string of the word "Baker" will be explained.

The encoding device stores a character string of the word "Baker" in the buffering unit D1. The encoding device registers a storage position where the character string of the word is stored and the stored data length in the address table D2. Moreover, the encoding device registers the word code and the external dictionary ID, which are assigned to the character string of the word "Baker", in the address table D2. Herein, the encoding device registers, in the address table D2, "16" as the storage position, "6" as the data length, "53" as the external dictionary ID, and "CD0009h" as the word code.

The encoding device encodes a character string of a word into a word code in the address table D2 associated with the character string of this word. Herein, the encoding device encodes the character string of the word "Baker" into a dynamic code "A002h" associated with the character string of this word.

One Example of Configuration of Bitmap-Type Index

Figure 4:
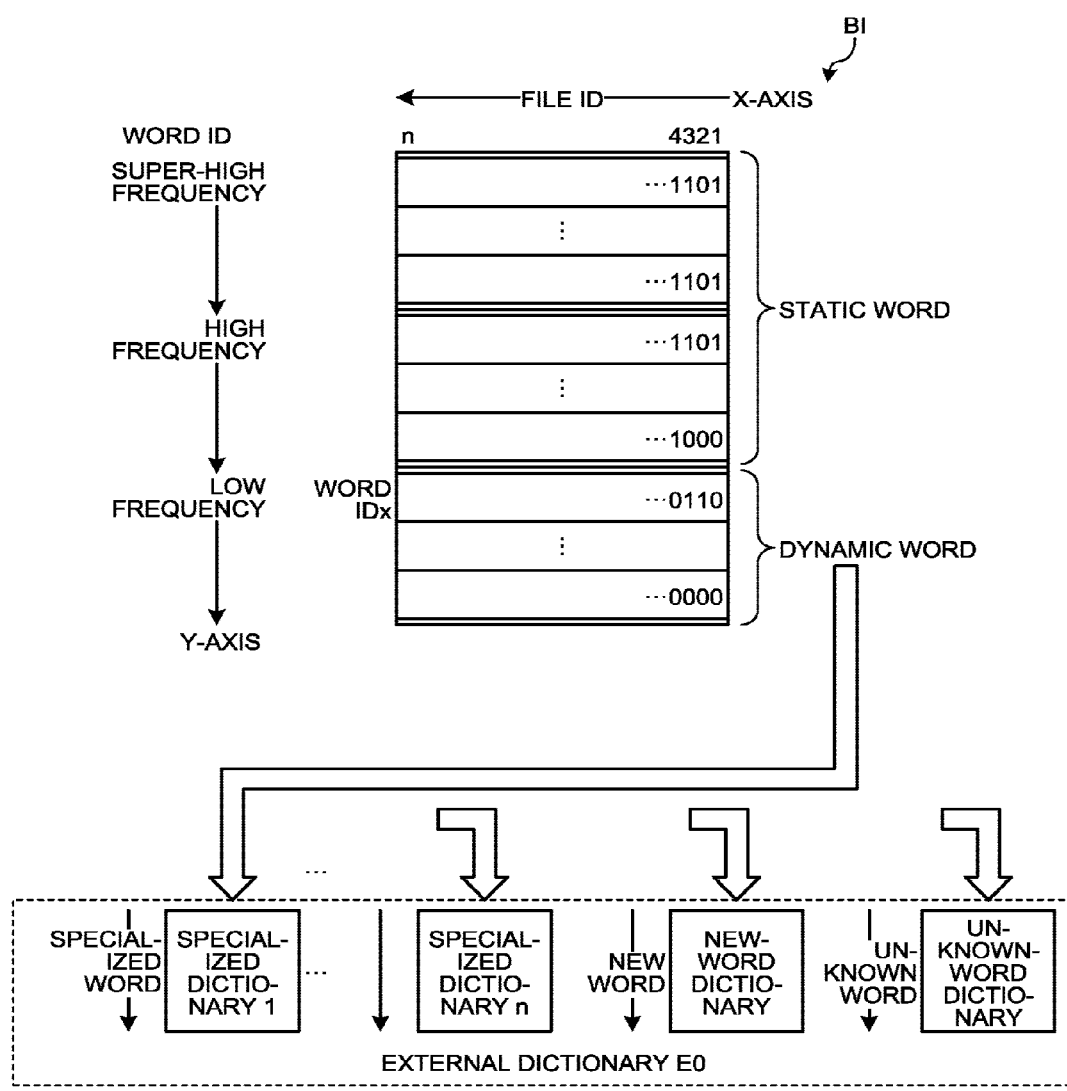
FIG. 4 is a diagram illustrating a configuration example of the bitmap-type index.

FIG. 4 is a diagram illustrating a configuration example of the bitmap-type index. As illustrated in FIG. 4, the bitmap-type index BI associates bitmaps with word IDs of super-high frequency words, high frequency words, and low frequency words, respectively. Each bit of the bitmap indicates whether or not a word indicated by a word ID corresponding to this bitmap is included.

Word IDs of the super-high frequency words and word IDs of high frequency words are registered in the static dictionary S0. Word IDs of low frequency words are registered in the external dictionary E0. Namely, the word IDs of the low frequency words are communalized by specialized dictionaries, new-word dictionaries, and unknown-word dictionaries. The word IDs of the low frequency words are registered in the dynamic dictionary D0 together with respective dynamic codes.

For example, regarding the word IDs of the low frequency words, a bitmap of a word IDx is " . . . 0110". The bitmap " . . . 0110" indicates that a word indicated by the word IDx is not included in a file 1 because "0" is stored in the first bit, the word indicated by the word IDx is included in a file 2 because "1" is stored in the second bit, and the word indicated by the word IDx is included in a file 3 because "1" is stored in the third bit. The bitmap " . . . 0110" indicates that the word indicated by the word IDx is not included in a file 4 because "0" is stored in the fourth bit. Moreover, the bitmap " . . . 0110" also indicates whether or not the word IDx is included in each of the other files after a file 5.

Configuration Example of Encoded File

Figure 5:
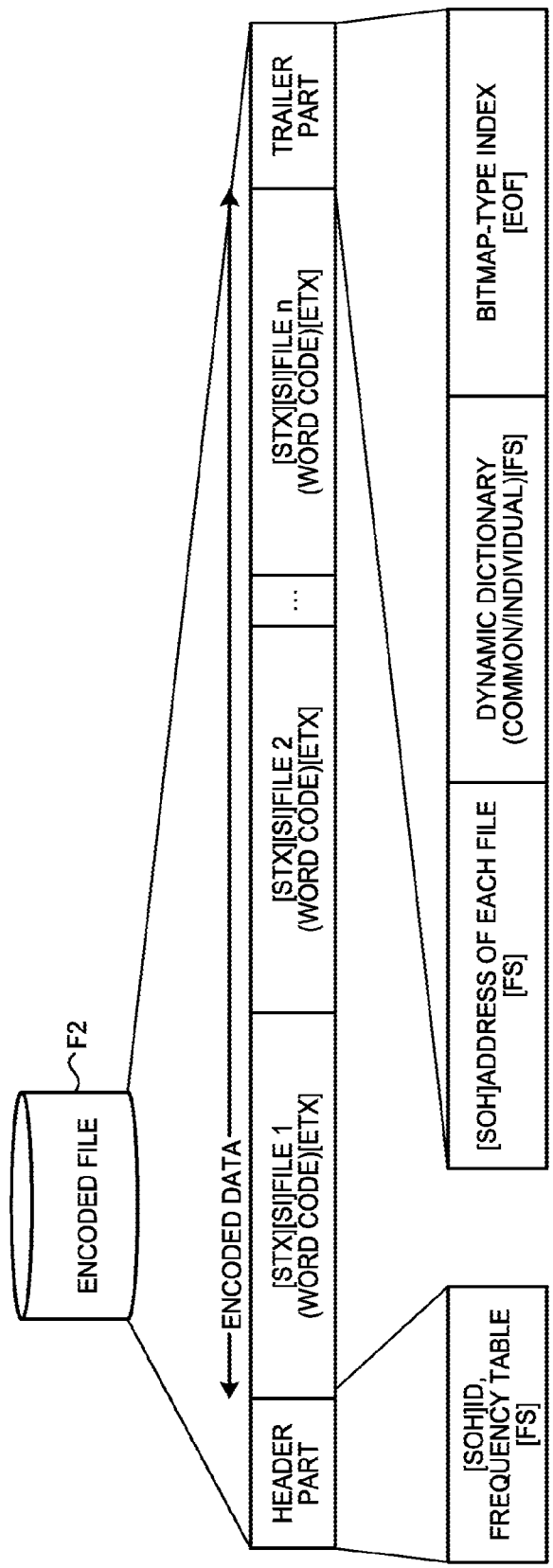
FIG. 5 is a diagram illustrating a configuration example of an encoded file.

FIG. 5 is a diagram illustrating a configuration example of an encoded file. As illustrated in FIG. 5, an encoded file F2 includes a header part, encoded data, and a trailer part. The encoded data memorizes a group of encoded word codes of each of the files. The trailer part memorizes an address of each of the files, information on the dynamic dictionary D0 of each of the files, the bitmap-type index BI, etc. The address of each of the files indicates an address where encoded data that are encoded files are respectively stored. The address of each of the files is, as one example, a relative address from the head of the encoded data. Information on the dynamic dictionary D0 of each of the files corresponds to information on the dynamic dictionary illustrated in FIG. 3 for each of the files. The bitmap-type index BI indicates a bitmap-type index corresponding to the plurality of files. The header part stores a pointer to the address of each of the files and a pointer to the dynamic dictionary D0 stored in the trailer part. When encoding the plurality of files, the encoding device stores each encoded data that is the encoded result in the encoded file F2, and stores the stored addresses in addresses of the respective files. A decoding process refers to, by using a pointer to an address of each of the files in the header part, an address of a file to be decoded from the addresses of the files in the trailer part. A decoding process refers to the dynamic dictionary D0 by using a pointer to the dynamic dictionary D0 in the header part.

Configuration of Encoding Device

Figure 6:
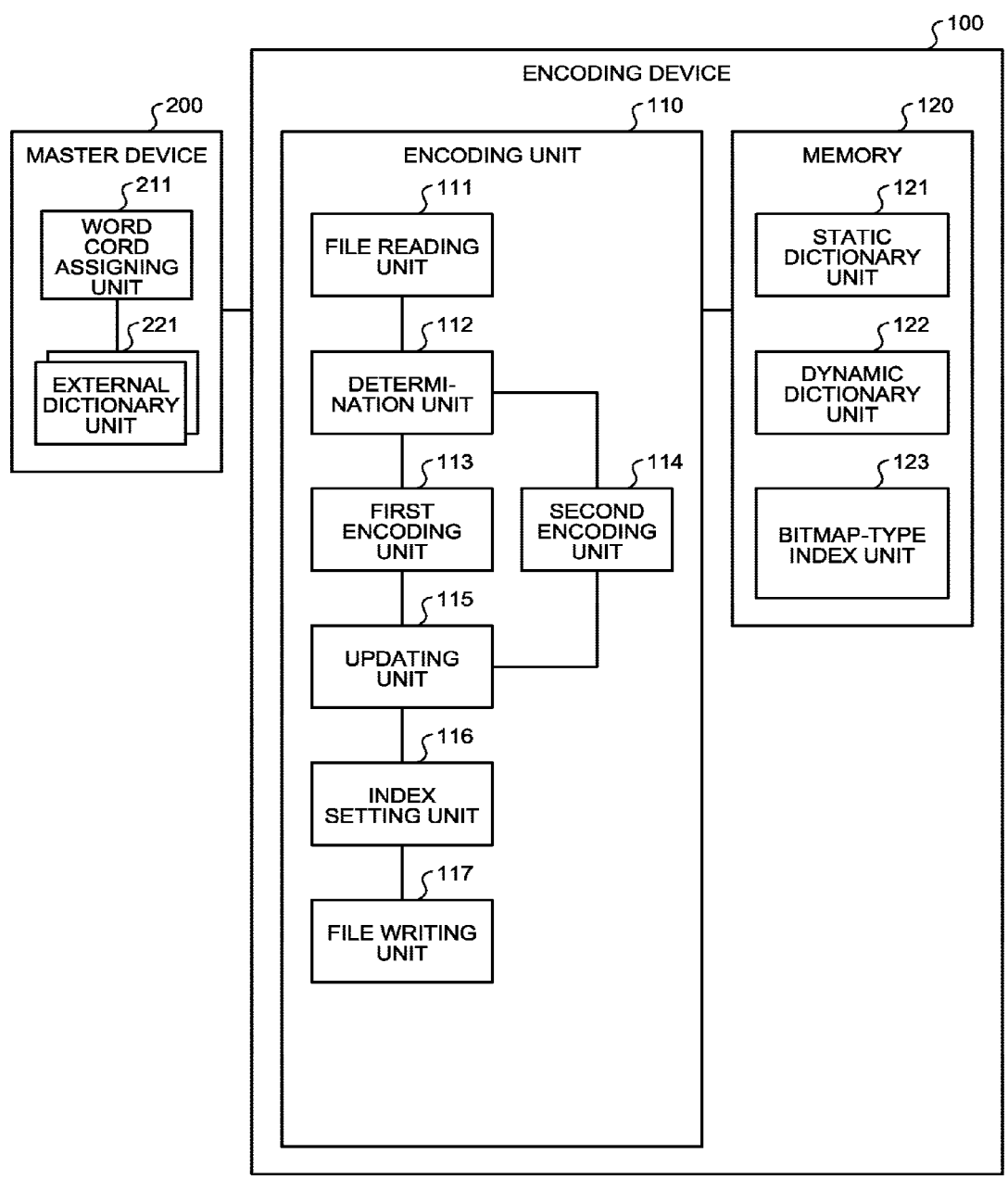
FIG. 6 is a functional block diagram illustrating a configuration example of an encoding device according to the first embodiment.

FIG. 6 is a functional block diagram illustrating a configuration example of the encoding device according to the first embodiment. As illustrated in FIG. 6, an encoding device 100 is connected to a master device 200.

The master device 200 includes a word cord assigning unit 211 and an external dictionary unit 221.

The external dictionary unit 221 is a dictionary that associates words not registered in a static dictionary unit 121 with respective word codes for each specialty. The external dictionary unit 221 includes, for example, specialized dictionaries, new-word dictionaries, and unknown-word dictionaries. As one example, the external dictionary unit 221 associates character strings of words with respective word codes for each dictionary. The external dictionary unit 221 corresponds to the external dictionary E0.

When accepting an inquiry of a word code corresponding to the character string of the word from the encoding device 100, the word cord assigning unit 211 assigns the word code corresponding to the character string of the word by using the external dictionary unit 221. The word cord assigning unit 211 transmits, to the encoding device 100, a reply including the assigned word code and an ID of a dictionary in which the word is registered.

The encoding device 100 includes an encoding unit 110 and a memory 120.

The encoding unit 110 is a process unit that executes a generating process of the bitmap-type index illustrated in FIG. 2. The encoding unit 110 includes a file reading unit 111, a determination unit 112, a first encoding unit 113, a second encoding unit 114, an updating unit 115, an index setting unit 116, and a file writing unit 117.

The memory 120 corresponds to a memory device that is, for example, a non-volatile semiconductor memory element such as a Flash Memory and a Ferroelectric Random Access Memory (FRAM: Registered Trademark). The memory 120 includes the static dictionary unit 121, a dynamic dictionary unit 122, and a bitmap-type index unit 123.

The static dictionary unit 121 is a dictionary in which the appearance frequencies of words appearing in documents are specified on the basis of general English-language dictionaries, general Japanese-language dictionaries, general textbooks, etc., and shorter codes are assigned to words whose appearance frequencies are higher. The static dictionary unit 121 corresponds to the static dictionary S0.

The dynamic dictionary unit 122 is a dictionary in which words not registered in the static dictionary unit 121 are associated with respective dynamic codes assigned dynamically and the word codes. The dynamic dictionary unit 122 corresponds to the dynamic dictionary D0. The explanation of the dynamic dictionary unit 122 is similar to that of FIG. 3, and thus the explanation thereof is omitted.

The file reading unit 111 reads out, in a memory region, one target file included in a file F1 to be encoded. The file reading unit 111 reads out the target file from the memory region, and executes lexical analysis on the read out target file. The file reading unit 111 sequentially outputs the words of the lexically analyzed results to the determination unit 112.

The determination unit 112 determines whether or not the word is registered in the static dictionary unit 121. For example, the determination unit 112 determines whether or not a character string of the word output from the file reading unit 111 is hit in the bit filter of the static dictionary unit 121. When determining that the character string is not hit in the bit filter of the static dictionary unit 121, the determination unit 112 outputs the character string of the word to the first encoding unit 113. When determining that the character string is hit in the bit filter of the static dictionary unit 121, the determination unit 112 outputs the character string of the word to the second encoding unit 114.

The first encoding unit 113 encodes the character string of the word on the basis of the dynamic dictionary unit 122. For example, the first encoding unit 113 determines whether or not the character string of the word is already stored in the buffering unit D1 of the dynamic dictionary unit 122. When the character string of the word is not already stored in the buffering unit D1 of the dynamic dictionary unit 122, the first encoding unit 113 inquires the master device 200 about a word code corresponding to the character string of this word. When accepting a reply to the inquiry from the master device 200, the first encoding unit 113 stores a word code and an ID of a dictionary in which the word is registered, which are included in this reply, in a record corresponding to a new dynamic code in the address table D2. In addition, the first encoding unit 113 stores the character string of the word in the buffering unit D1, and further stores a storage position where the character string of this word is stored and the length of the stored data in the record corresponding to the new dynamic code of the address table D2. The first encoding unit 113 encodes the character string of the word into a word code of the address table D2 which is associated with the character string of this word. The first encoding unit 113 outputs the encoded word code to the updating unit 115.

The second encoding unit 114 encodes a character string of a word on the basis of the static dictionary unit 121. For example, the second encoding unit 114 encodes the character string of the word into a static code (word code) corresponding to the character string of this word on the basis of a static dictionary of the static dictionary unit 121. The second encoding unit 114 outputs the encoded word code to the updating unit 115.

The updating unit 115 acquires the word codes from the first encoding unit 113 and the second encoding unit 114, and accumulates, in the order of the acquisition, the acquired word codes in a memory region of the encoded data corresponding to the target file, and thus updates this memory region.

The index setting unit 116 sets, in the bitmap-type index unit 123, presence/absence of the encoded word code in the target file. For example, the index setting unit 116 sets, in a bitmap corresponding to the encoded word code, "1" indicating the presence for a bit corresponding to a file ID of the target file.

The file writing unit 117 encodes all of the plurality of target files of the file F1 to be encoded, and then stores each encoded data (word code) written into the memory region in the encoded file F2. The file writing unit 117 writes, into the trailer part of the encoded file F2, information on the dynamic dictionary unit 122 of the target files and the addresses of encoded data and the bitmap-type index unit 123, which are the encoded results of the target files.

Processing Procedure of Encoding Process

Figure 7:
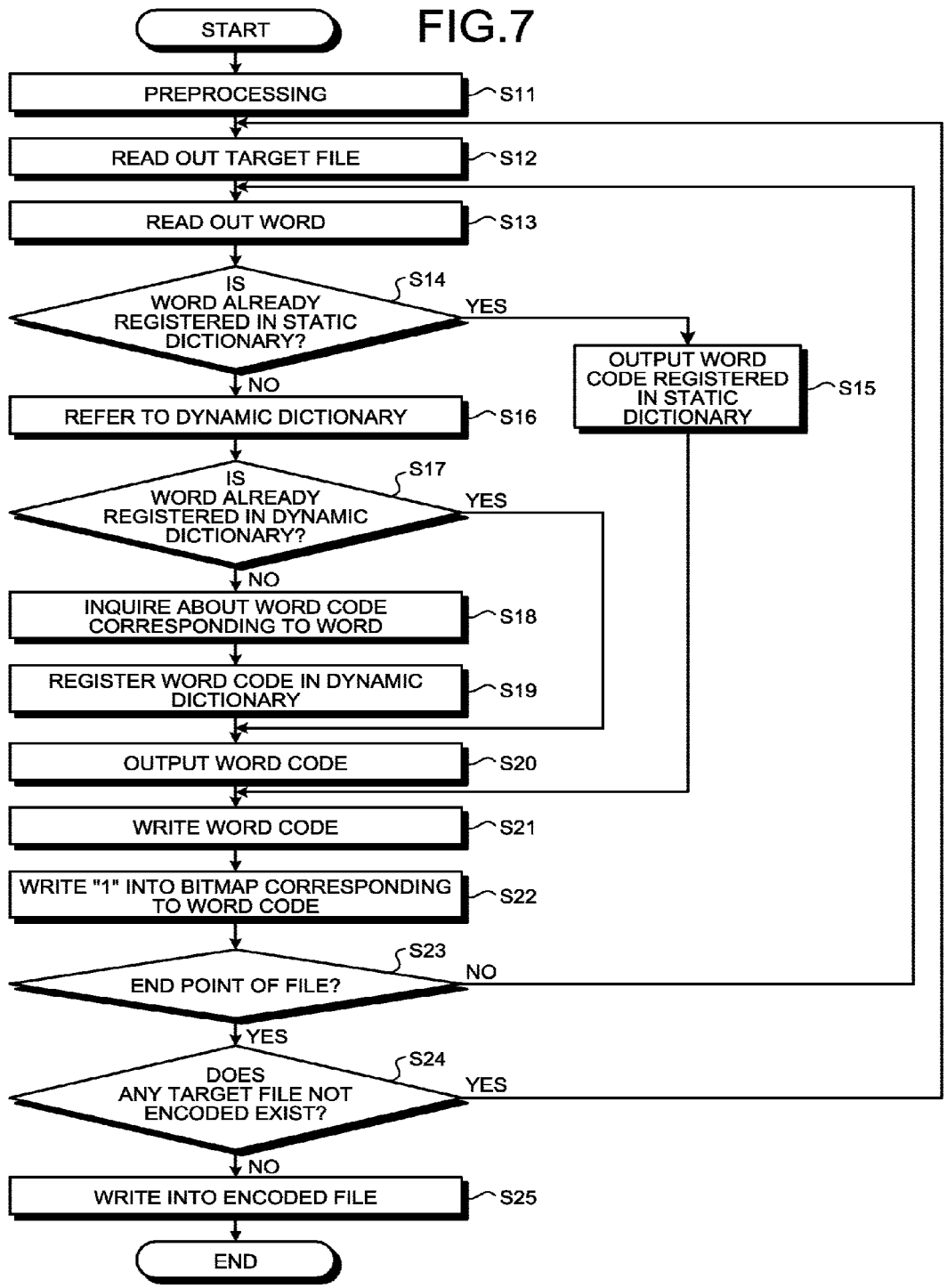
FIG. 7 is a flowchart illustrating one example of an encoding process according to the first embodiment.

Next, a processing procedure of the encoding unit 110 indicated in FIG. 6 will be explained with reference to FIG. 7. FIG. 7 is a flowchart illustrating one example of an encoding process according to the first embodiment.

As illustrated in FIG. 7, the encoding unit 110 executes preprocessing (Step S11). For example, the encoding unit 110 ensures various memory regions in the memory 120. The encoding unit 110 reads out a character string of one target file out of a plurality of target files in the file F1 to be encoded, and stores the file in a memory region for being read out (Step S12).

The encoding unit 110 reads out the character string of words of one target file from the memory region for being read out (Step S13). For example, the encoding unit 110 executes lexical analysis on one target file, and reads out a character string of the words of a lexically analyzed result from the head.

The encoding unit 110 determines whether or not the character string of the word is already registered in the static dictionary unit 121 (Step S14). When determining that the character string of the word is already registered in the static dictionary unit 121 (Step S14: Yes), the encoding unit 110 outputs a static code (word code) registered in the static dictionary unit 121 (Step S15). The encoding unit 110 shifts to Step S21.

On the other hand, when determining that the character string of the word is not already registered in the static dictionary unit 121 (Step S14: No), the encoding unit 110 refers to the dynamic dictionary unit 122 (Step S16). The encoding unit 110 determines whether or not the character string of the word is already registered in the dynamic dictionary unit 122 (Step S17). For example, the encoding unit 110 determines whether or not the character string of the word is already stored in the buffering unit D1 of the dynamic dictionary unit 122.

When determining that the character string of the word is already registered in the dynamic dictionary unit 122 (Step S17: Yes), the encoding unit 110 shifts to Step S20.

On the other hand, when determining that the character string of the word is not already registered in the dynamic dictionary unit 122 (Step S17: No), the encoding unit 110 inquires the master device 200 about a word code corresponding to this word (Step S18). The encoding unit 110 registers a word code included in a reply to the inquiry from the master device 200 in the dynamic dictionary unit 122 (Step S19). For example, the encoding unit 110 stores a word code and an ID of a dictionary in which the word is registered, which are included in the reply to the inquiry, in a record corresponding to a new dynamic code of the address table D2. In addition, the encoding unit 110 stores the character string of the word in the buffering unit D1, and further stores, in the record corresponding to the new dynamic code of the address table D2, a storage position where the character string of this word is stored and the length of the stored data. The encoding unit 110 shifts to Step S20.

In Step S20, the encoding unit 110 outputs the dynamic code registered in the dynamic dictionary unit 122 (Step S20). For example, the encoding unit 110 encodes the character string of the word into a word code of the address table D2, which is associated with the character string this word. The encoding unit 110 outputs the encoded word code. The encoding unit 110 shifts to Step S21.

In Step S21, the encoding unit 110 writes the output word code into a memory region for encoded data, which corresponds to the target file (Step S21). The encoding unit 110 writes "1" into a bitmap corresponding to the word code (Step S22). Namely, the encoding unit 110 sets, in the bitmap corresponding to the word code, "1" indicating the presence for a bit corresponding to a file ID of the target file.

The encoding unit 110 determines whether or not it is an end point of the target file (Step S23). When determining that it is not the end point of the target file (Step S23: No), the encoding unit 110 shifts to Step S13 so as to read out the next word of the target file.

On the other hand, when determining that it is the end point of the target file (Step S23: Yes), the encoding unit 110 determines whether or not there exists an target file not encoded (Step S24). When determining that there exists the target file not encoded (Step S24: Yes), the encoding unit 110 shifts to Step S12 so as to encode the next target file.

When determining that there exists no target file not encoded (Step S24: No), the encoding unit 110 writes the encoded data memorized in the memory region for encoded data into the encoded file F2 (Step S25). In this case, the encoding unit 110 writes information on the dynamic dictionary unit 122 of each of the target files, the address of encoded data of each of the target files, and the bitmap-type index unit 123 into the trailer part of the encoded file F2. The encoding unit 110 terminates the encoding process.

Thus, when encoding a word included in a file of an encoding target by using the static dictionary unit 121 and the dynamic dictionary unit 122, the encoding device 100 extracts from words not included in the static dictionary unit 121 in this file, a word included in the external dictionary unit 221. The extracted word is a registered word being included in the external dictionary unit 221 and registered in the dynamic dictionary unit 122. The encoding device 100 associates a code associated with the registered word from the external dictionary unit 221 with a dynamic code to be assigned dynamically so as to register in the dynamic dictionary unit 122. By employing this configuration, even a word registered in the dynamic dictionary unit 122, the encoding device 100 can register the word together with a code associated with the external dictionary unit 221, and thus this code can be used by a plurality of files to be encoded in common. Namely, the encoding device 100 can realize the commonization of codes for, for example, a specialized word, a new word, and an unknown word. As a result, the encoding device 100 can easily generate presence/absence information of each word of the plurality of files to be encoded.

[b] Second Embodiment

Meanwhile, in the first embodiment, the case is explained, in which the encoding device 100 generates one bitmap-type index BI indicating presence/absence information on each word of the plurality of files to be encoded. However, the encoding device 100 may generate, not limited thereto, the plurality of bitmap-type indexes BI indicating presence/absence information of each word of the plurality of files to be encoded, and may hierarchize the bitmap-type indexes BI.

In the second embodiment, the case will be explained, in which the encoding device 100 generates the plurality of bitmap-type indexes BI indicating presence/absence information of each word of the plurality of files to be encoded, and hierarchizes the bitmap-type indexes BI.

Hierarchization of Bitmap-Type Indexes

Figure 8:
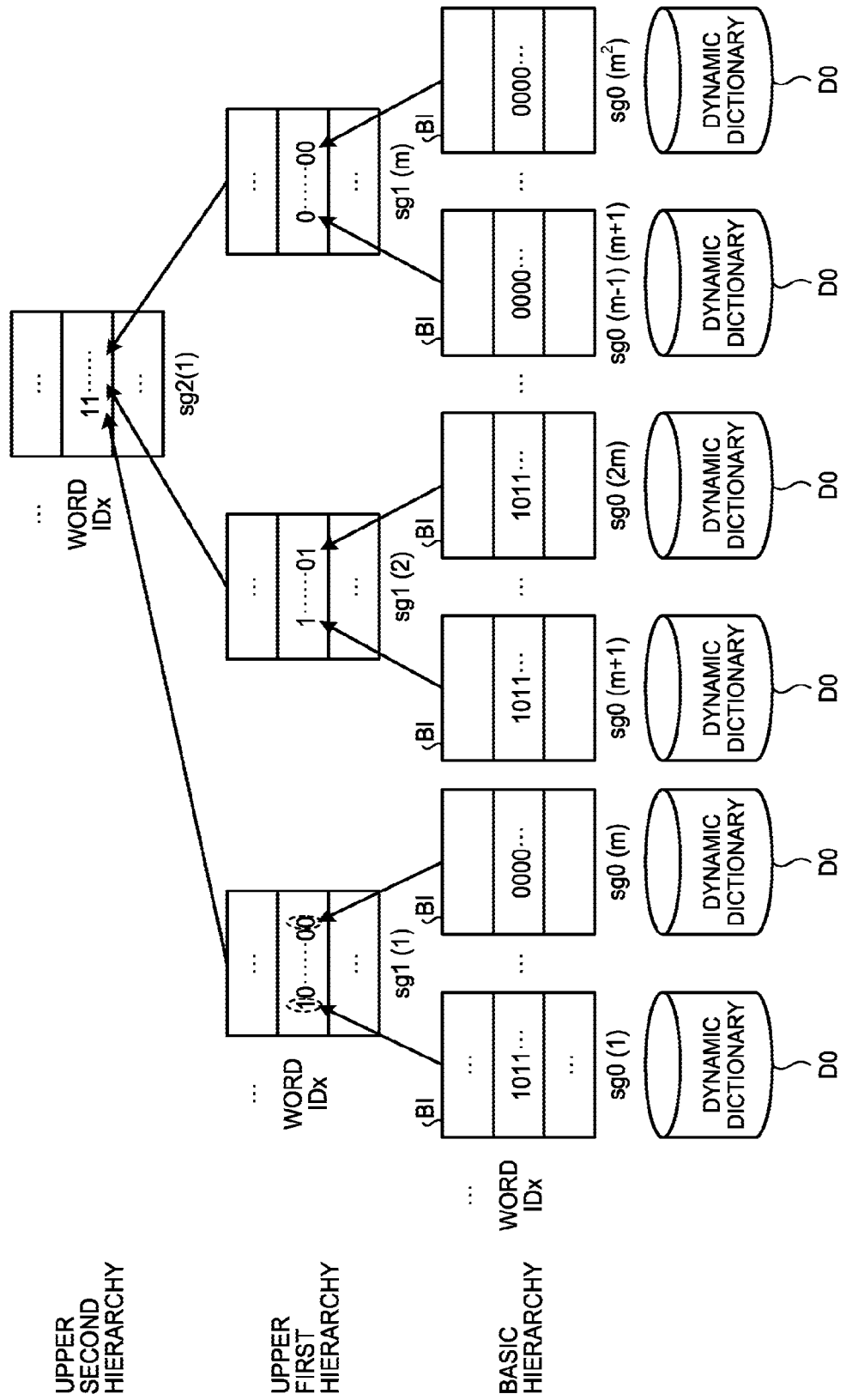
FIG. 8 is a diagram illustrating one example of hierarchization of bitmap-type indexes according to a second embodiment.

FIG. 8 is a diagram illustrating one example of hierarchization of bitmap-type indexes according to the second embodiment. As illustrated in FIG. 8, the bitmap-type index BI is divided by "n" that is a predetermined number of files. Herein, "n" is, for example, 256. Each of the divided indexes is referred to as a segment.

The segment sg0(1) is a segment including the bitmap-type index BI of files f1 to fn to be encoded. The segment sg0(2) is a segment including the bitmap-type index BI of files f(n+1) to f(2n) to be encoded. The segment sg0(3) is a segment including the bitmap-type index BI of files f(2n+1) to f(3n) to be encoded.

In an initial state, there exists only the segment sg0(1) as a segment, when the number of the files exceeds "n" caused by addition of files, the segment sg0(2) is generated, when the number of the files exceeds "2n", the segment sg0(3) is generated.

The bitmap-type index BI of each of the segments includes a bitmap whose words are the same. However, file IDs taken charge of by the index differs from each other. The file IDs taken charge of in the bitmap-type index BI of each of the segments are file IDs of the encoded file F2 held by the corresponding segment. For example, the bitmap-type index BI of the segment sg0(1) includes a bit string indicating the presence/absence of file IDs 1 to n corresponding to a bitmap of each of words. The bitmap-type index BI of the segment sg0(m) includes a bit string indicating the presence/absence of file IDs (m−1)n to mn corresponding to bitmap of each of the words.

Figure 9:
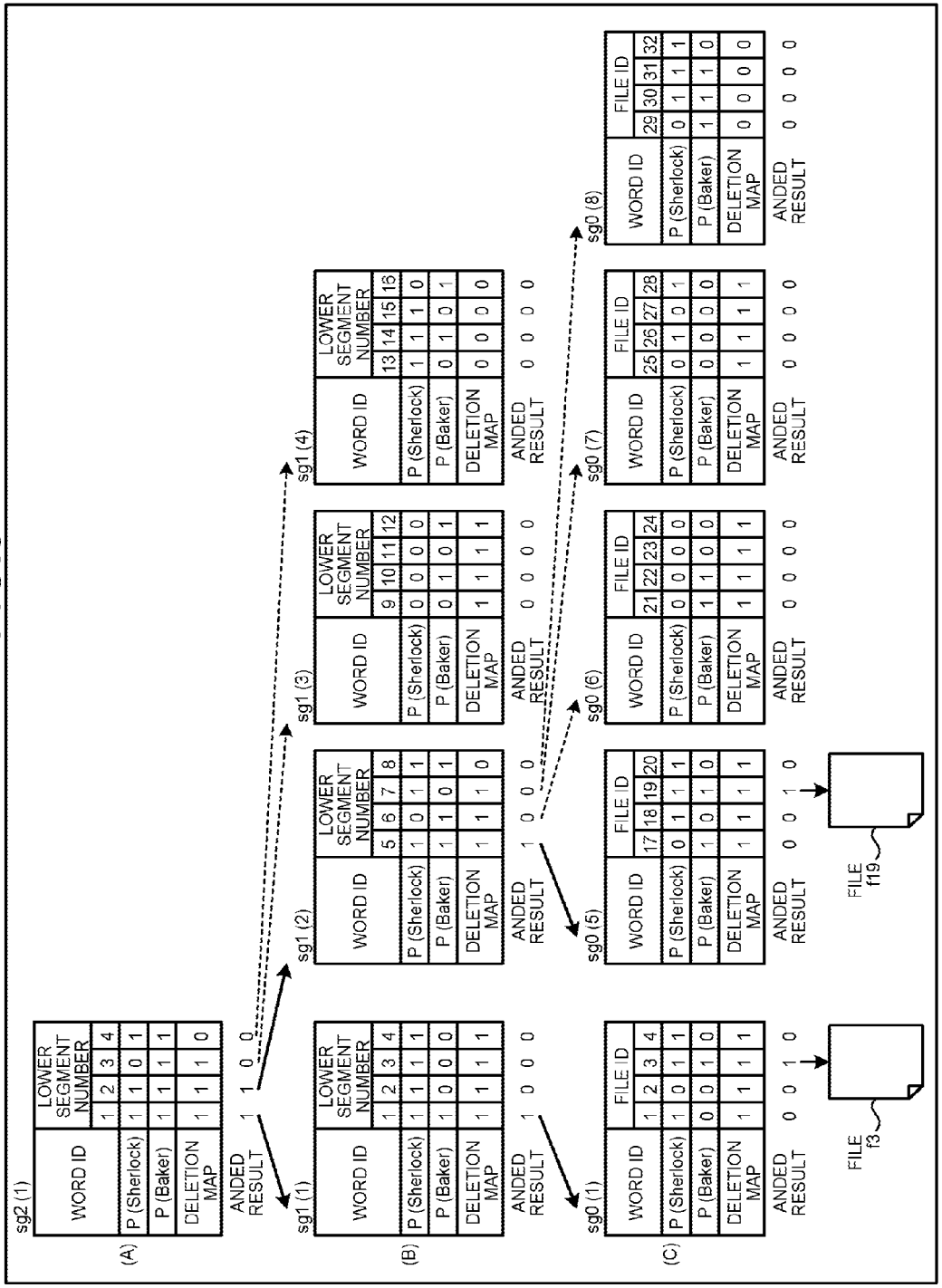
FIG. 9 is a diagram illustrating an example of narrowing down files by using hierarchized segment groups.

The dynamic dictionary D0 is a dictionary that associates respective words not registered in the static dictionary S0 but registered in the external dictionary E0, codes in the external dictionary E0, and dynamic codes assigned dynamically with each other. Namely, when a code corresponding to a character string of the word does not exist in the static dictionary S0, the encoding device acquires, from the external dictionary E0, a code (word code) corresponding to the character string of the word and an ID of the external dictionary E0 in which this word code is registered. The encoding device registers, in the dynamic dictionary D0, the character string of the word, the code (word code) acquired from the external dictionary E0, and the dynamic code assigned dynamically. The dynamic dictionary D0 according to the first embodiment is generated by file unit. However, the dynamic dictionary D0 may be generated by file unit or by segment unit. In FIG. 9, the dynamic dictionary D0 is generated by segment unit.

Herein, when the number of the segments increases, bitmaps become redundant for respective word IDs. When the bitmaps become redundant, ON/OFFs of respective bits indicating presence/absence are needed to be checked with respect to all the number of the files for respective word IDs, it is no use checking parts of not existing (OFF). Therefore, bitmaps are to be aggregated by m when m+1 segments are generated for each word ID.

In FIG. 9, for example, the case in which bitmaps of the word IDx indicated by a word "x" is aggregated in an upper hierarchy will be explained as an example. Herein, X of "sgX(Y)" indicates a hierarchy number, and Y indicates a segment number. Therefore, sgX(Y) indicates the Y-th segment in the X-th hierarchy. The segments sg0(1) to sg0(m) having been explained are segments of a zero hierarchy that is a basic hierarchy.

First, an aggregation example from a zero hierarchy of a basic hierarchy to a first hierarchy of an upper hierarchy will be explained. As a rule of the aggregation, when a bit string that is a bitmap of a segment in a target hierarchy is all-zero, namely, the word "x" does not exist in target file groups in the segment, aggregated into "0" as an index of an upper hierarchy. On the other hand, at least one "1" exists in a bit string that is a bitmap of a segment in a target hierarchy, namely, the word "x" exists in target file groups in the segment, aggregated into "1" as an index of the upper hierarchy.

For example, "1" exists in the segment sg0(1), "1" is set in the segment sg1(1) of the upper hierarchy. Similarly, the segment sg0(m) is all-zero, "0" is set in the segment sg1(1) of the upper hierarchy. A bit position of a bitmap of the segment sg1(1) in this upper hierarchy indicates positions of the lower segments sg0(1) to sg0(m). Thus, states of bitmaps in the lower segment can be specified by using a bit value of a segment in an upper hierarchy.

Such an aggregation is executed not only between the zero hierarchy and the first hierarchy, when the number of the segments becomes "m" in an uppermost hierarchy, a segment of an upper hierarchy is newly generated. For example, when segments are generated up to the segment sg1(m) in the first hierarchy, the segment sg2(1) of the second hierarchy is generated. In FIG. 9, the example up to the second hierarchy is illustrated, may be aggregated into a hierarchy of equal to or more than third hierarchy in accordance with increase in the scale of data.

Narrowing-Down Example of Files Using Hierarchized Segment Group

FIG. 9 is a diagram illustrating an example of narrowing down files by using hierarchized segment groups. In FIG. 9, for simplification of the explanation, "n" is set to be four which is the numbers of files of each segment in a zero hierarchy and "m" is set to be four. Therefore, the segments exist from sg0(1) up to sg0(16) in the zero hierarchy, however, the explanation of the not illustrated segments is omitted. In FIG. 9, the uppermost hierarchy is explained to be a second hierarchy. In FIG. 9, solid-line arrows indicate that segments of lower hierarchies are specified in accordance with ANDed results, and dotted-line arrows are not actually specified, however, illustrated for comparison with the specified segments. In FIG. 9, the case is assumed that "SherlockABaker" is input as a character string for retrieval. P(s) is assumed to indicate a word ID of a word "s". Delete maps in FIG. 9 indicate bitmaps indicating whether or not each of the files is deleted, and a case of "1" indicates deleted and a case of "0" indicates undeleted. In the retrieval, the deletion maps are inverted, and then AND operations to other bitmaps are executed.

In (A), for a segment sg2(1) of the second hierarchy that is the uppermost hierarchy, an AND operation between a bitmap of P(Sherlock) indicating a word ID of a word "Sherlock", a bitmap of P(Baker) indicating a word ID of a word "Baker", and an aggregated deletion map is executed. The ANDed result is "1100", and thus it is found that there exists the probability the words "Sherlock" and "Baker" exist in the segments sg1(1) and sg1(2) in a first hierarchy that is a lower hierarchy.

In the segment sg2(1) in the second hierarchy that is the uppermost hierarchy, the ANDed results of lower segment numbers 3 and 4 are "0". Therefore, without executing AND operations of the respective segments sg1(3) and sg1(4), it is found that ANDed results of the respective segments sg1(3) and sg1(4) are all-zero.

In (B), because the segments sg1(1) and sg1(2) in the first hierarchy are specified from the ANDed results of the second hierarchy, AND operations similar to those of (A) are executed on the segments sg1(1) and sg1(2). Thus, the segment sg0(1) is specified from the segment sg1(1), and the segment sg0(5) is specified from the segment sg1(2). Focusing on the segment sg1(2), ANDed results of lower segment numbers 6 to 8 are "0". Therefore, without executing AND operations of the respective segments sg0(6) to sg0(8), it is found that ANDed results of the respective segments sg0(6) to sg0(8) are all-zero.

In (C), because the segments sg0(1) and sg0(5) of the zero hierarchy are specified from the ANDed results of the first hierarchy, AND operations similar to those of (A) and (B) are executed on the segments sg0(1) and sg0(5). Thus, a file ID 3 is specified from the segment sg0(1), and a file ID 19 is specified from the segment sg0(5). Therefore, it is found that both words "Sherlock" and "Baker" exist in each of the files f3 and f19.

Thus, the encoding device decodes encoded data existing in an address in the file f3 within encoded data in the encoded file F2 by using the static dictionary S0 and the dynamic dictionary D0, and thus can acquire the file f3 including retrieval words. The encoded file F2 mentioned here is an encoded file corresponding to the segment sg0(1). The dynamic dictionary D0 mentioned here is a dynamic dictionary corresponding to the segment sg0(1). The encoding device decodes encoded data existing in an address in the file f19 within encoded data in the encoded file F2 by using the static dictionary S0 and the dynamic dictionary D0, and thus can acquire the file f19 including retrieval words. The encoded file F2 mentioned here is a encoded file corresponding to the segment sg0(5), and the dynamic dictionary D0 mentioned here is a dynamic dictionary corresponding to the segment sg0(5).

Figure 10:
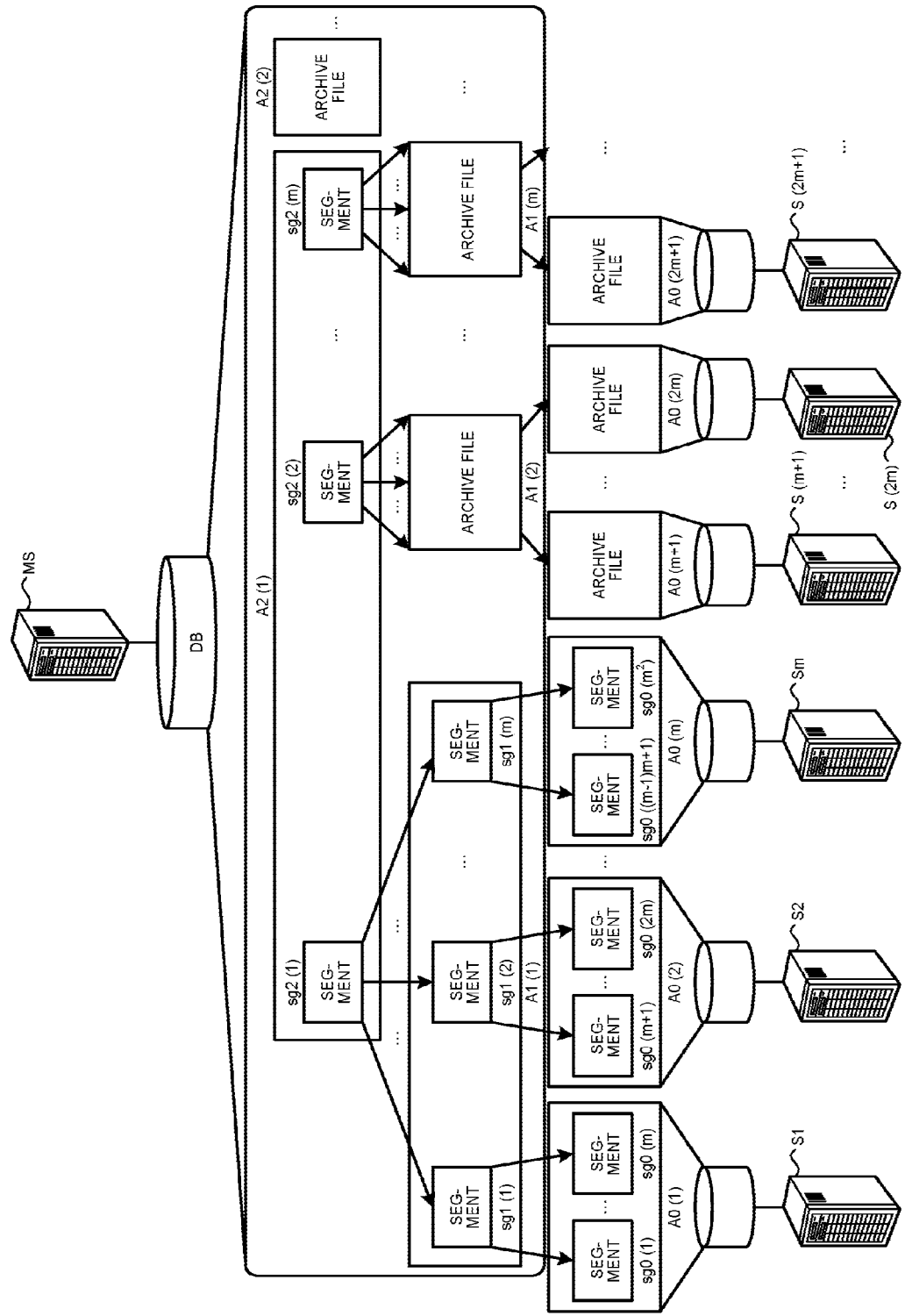
FIG. 10 is a diagram illustrating a configuration example of a computer system on which the hierarchized segment groups are implemented.

Configuration Example of Computer System in which Hierarchized Segment Groups are Implemented FIG. 10 is a diagram illustrating a configuration example of a computer system in which the hierarchized segment groups are implemented. In FIG. 10, one archive file is assumed to include "m" segments. "AX(Y)" is a code of an archive file, "X" indicates a hierarchy number, and "Y" indicates an archive number. Therefore, "AX(Y)" indicates the Y-th archive file of the X-th hierarchy. For example, an archive file A0(1) is an aggregation of the segments sg0(1) to sg0(m) in a zero hierarchy.

In an example illustrated in FIG. 10, a master server MS stores archive files of equal to or upper than the first hierarchy. Each of the slave servers S1, S2, . . . , S(2m+1), . . . stores one archive file assigned by the master server MS. Each of the slave servers corresponds to, for example, the encoding device 100. The number of assigned archive files illustrated in FIG. 10 is one, the master server MS is not needed to take charge of all of the archive files of equal to or upper than the first hierarchy, and may be distributed to another server. At least one of the slave servers S1, S2, . . . , S(2m+1), . . . , may take charge of, not one archive file, but a plurality of archive files.

Therefore, the computer system including the encoding device 100 executes encoding and hierarchization on the basis of codes (word code) corresponding to, for example, specialized words, new words, and unknown words, and thus the performance of all of the slave servers is easily improved. In other words, the computer system can perform scale-out. Specifically, the master server MS can refer to ANDed results in the archive files taken charge of, and can assign the slave server to the segment so that the loads become even.

Other Embodiment Associated with Aforementioned Embodiments

Herein, a modified part of the aforementioned embodiment will be explained. Not only the following modification, but also design changes within a range of the main ideas of the present disclosure may be properly performed.

The information including the processing procedures, the control procedures, the specific appellations, and various data and parameters, which are indicated in the embodiment, may be arbitrarily changed without the case of special notes.

Hardware Configuration of Information Processing Device

Figure 11:
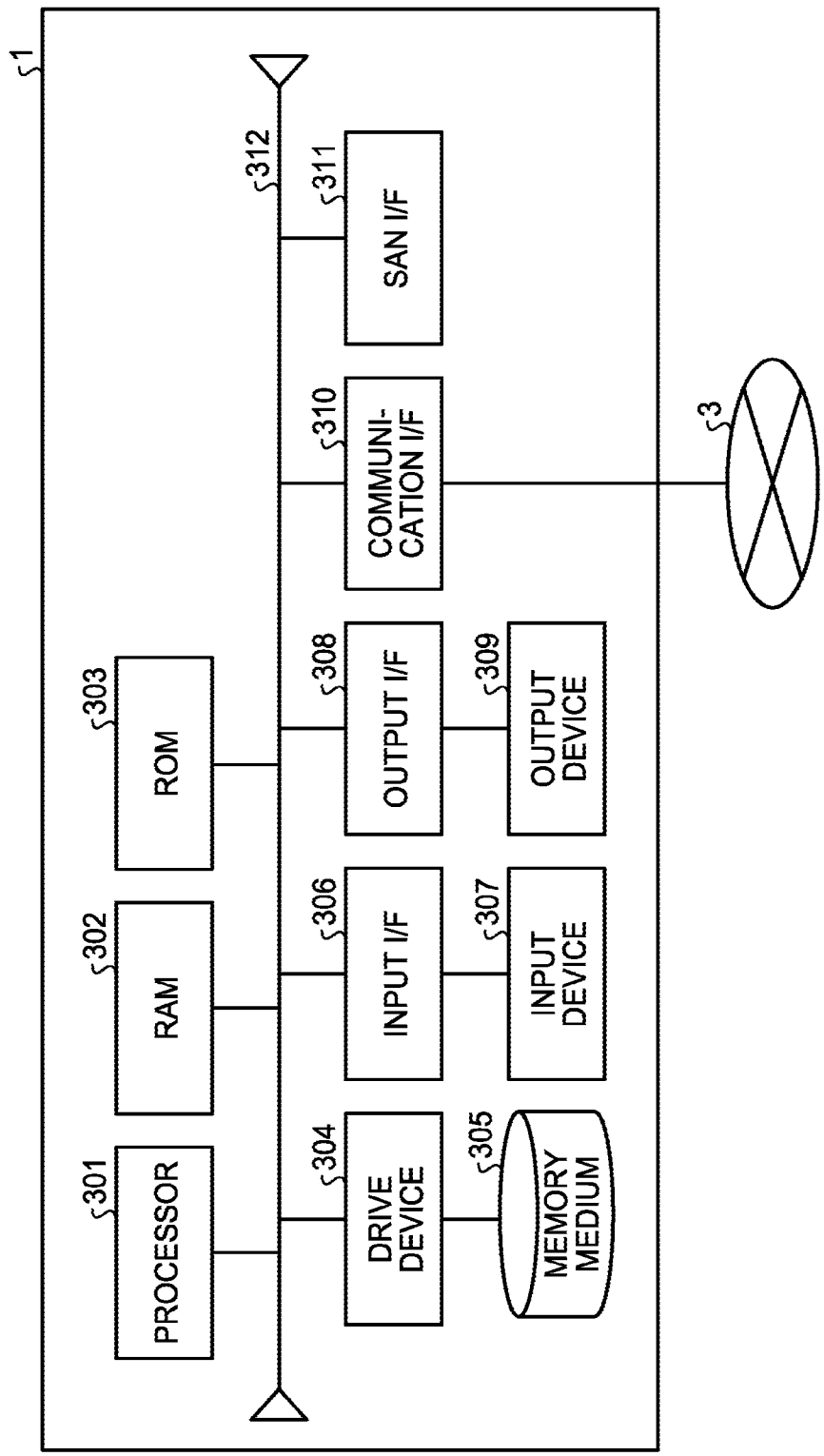
FIG. 11 is a diagram illustrating a hardware configuration example of a computer.

Hereinafter, the hardware and software to be used in the aforementioned embodiments will be explained. FIG. 11 is a diagram illustrating a hardware configuration example of a computer 1. The computer 1 includes, for example, a processor 301, a Random Access Memory (RAM) 302, a Read Only Memory (ROM) 303, a drive device 304, a memory medium 305, an input interface (I/F) 306, an input device 307, an output interface (I/F) 308, an output device 309, a communication interface (I/F) 310, a Storage Area Network interface (SAN I/F) 311, a bus 312, etc. The pieces of the hardware are connected with each other via the bus 312.

The RAM 302 is a memory device to be read out and written into, and a semiconductor memory such as a Static RAM (SRAM) and a Dynamic RAM (DRAM); a Flash Memory not the RAM; etc. may be used. The ROM 303 includes a Programmable ROM (PROM) and the like. The drive device 304 is a device that executes at least one of reading out and writing into of the information registered in the memory medium 305. The memory medium 305 memorizes information that is written into by the drive device 304. The memory medium 305 includes, for example, a hard disk; a Flash Memory such as a Solid State Drive (SSD); and a memory medium such as a Compact Disc (CD), a Digital Versatile Disc (DVD), and a Blu-ray Disc. In the computer 1, for example, the drive device 304 and the memory medium 305 are provided with respect to each of a plurality of kinds of the memory mediums.

The input interface 306 is a circuit that is connected to the input device 307, and transmits an input signal received from the input device 307 to the processor 301. The output interface 308 is a circuit that is connected to the output device 309, and causes the output device 309 to execute outputting in accordance with an instruction of the processor 301. The communication interface 310 is a circuit that executes control of communication via the network 3. The communication interface 310 is, for example, a Network Interface Card (NIC), etc. The SAN interface 311 is a circuit that executes control of communication with a memory device connected to the computer 1 by a storage area network. The SAN interface 311 is, for example, a Host Bus Adopter (HBA) and the like.

The input device 307 is a device that transmits input signals in accordance with operations. The input device 307 includes a key device such as a keyboard and buttons provided on a body of the computer 1; and a pointing device such as a mouse and a touch panel. The output device 309 is a device that outputs information in accordance with control of the computer 1. The output device 309 includes an image outputting device (display device) such as a display; and a sound outputting device such as a speaker. For example, an input/output device such as a touch screen is used as the input device 307 and the output device 309. The input device 307 and the output device 309 may be integrated with the computer 1, or may be a device that is not integrated with the computer 1 and, for example, is externally connected to the computer 1.

For example, the processor 301 reads out a program memorized in the ROM 303 and the memory medium 305 to the RAM 302, and executes a process of the encoding unit 110 in accordance with a procedure of the read out program. In this case, the RAM 302 is used as a work area of the processor 301. The ROM 303 and the memory medium 305 memorizes program files (application program (AP) 24, middleware (MW) 23, Operating System (OS) 22 to be mentioned later, etc.) and data files (for example, static dictionary unit 121, dynamic dictionary unit 122, bitmap-type index unit 123, etc.), and the RAM 302 is used as a work area of the processor 301, and thus functions of the memory 120 are realized. The program to be read out by the processor 301 will be explained with reference to FIG. 12.

Figure 12:
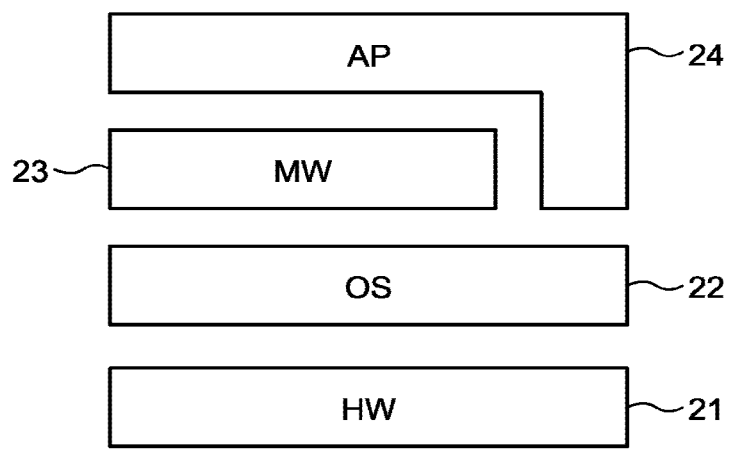
FIG. 12 is a diagram illustrating a configuration example of a program that operates in the computer.

FIG. 12 is a diagram illustrating a configuration example of a program that operates in the computer. In the computer 1, the OS 22 operates which executes control of a hardware group (HW) 21 (301 to 312) illustrated in FIG. 12. The processor 301 operates in a procedure according to the OS 22 to execute control/management of the hardware group (HW) 21, and thus a process according to an application program (AP) 24 and a middleware (MW) 23 is executed in the hardware group (HW) 21. Moreover, in the computer 1, the middleware (MW) 23 and the application program (AP) 24 are read out by the RAM 302 to be executed by the processor 301.

When the encoding function is called, the processor 301 executes processes based on at least a part of the middleware (MW) 23 and the application program (AP) 24, and (control hardware group (HW) 21 on the basis of OS 22 to execute these processes) the function of the encoding unit 110 is realized. The encoding function may be included in the application program (AP) 24, or may be a part of the middleware (MW) 23 that is called in accordance with the application program (AP) 24 so as to be executed.

Figure 13:
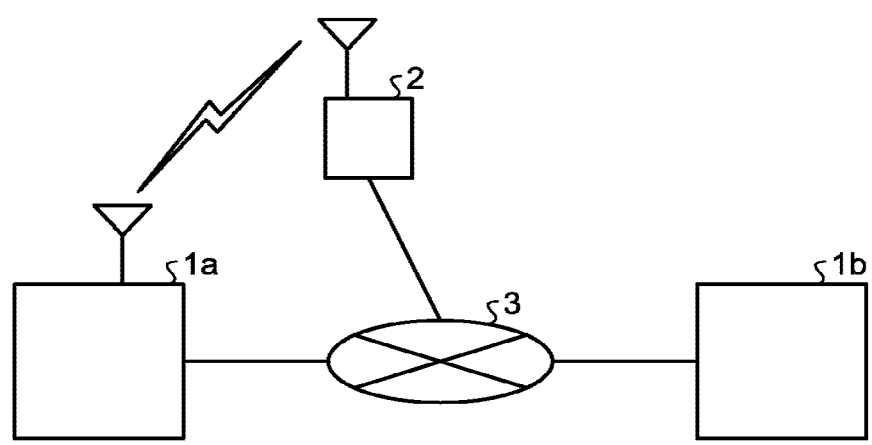
FIG. 13 is a diagram illustrating a configuration example of devices in the system according to the embodiment.

FIG. 13 is a diagram illustrating a configuration example of devices in a system according to the embodiment. The system illustrated in FIG. 13 includes a computer 1a, a computer 1b, a base station 2, and the network 3. The computer 1a is connected to the network 3 that is connected to the computer 1b in at least one of wireless and wired manners.

The encoding device 100 and the master device 200 illustrated in FIG. 6 may be included in any of the computer 1a and the computer 1b illustrated in FIG. 13. The computer 1b may include functions of the encoding device 100 and the computer 1a may include functions of the master device 200. The computer 1a may include functions of the encoding device 100 and the computer 1b may include functions of the master device 200. Each of the computers 1a and 1b may include the functions of the encoding device 100 and the functions of the master device 200.

According to one aspect of the embodiments, index information on a plurality of files can be generated even for a word to be registered in a dynamic dictionary. Moreover, index information on a plurality of files can be easily generated while distributing the index information to a plurality of small-scale systems even for a word to be registered in a dynamic dictionary.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A non-transitory computer readable recording medium having stored therein an encoding program that causes a computer to execute a process comprising:

extracting a registered word from a plurality of first words registered in a dynamic dictionary when encoding a target file with a static dictionary and the dynamic dictionary, the registered word being included in an external dictionary and registered in the dynamic dictionary, the external dictionary associating respective word in a specific word group and respective code in a code group, the plurality of first words in the dynamic dictionary being not registered in the static dictionary; and associating a corresponding code and a dynamic code of the registered word in the dynamic dictionary, the corresponding code being associated with the registered word in the external dictionary, the dynamic code being associated with the registered word in the dynamic dictionary.

2. The computer readable storage medium according to claim 1, the process further including:

setting, during the encoding, presence information indicating that the registered word exists in the target file for encoding to presence information indicating whether or not each of a plurality of predetermined words exists in each of a plurality of files.

3. An encoding device comprising:

a processor, wherein the processor executes a process comprising:

extracting a registered word from a plurality of first words registered in a dynamic dictionary when encoding a target file with a static dictionary and the dynamic dictionary, the registered word being included in an external dictionary and registered in the dynamic dictionary, the external dictionary associating respective word in a specific word group and respective code in a code group, the plurality of first words in the dynamic dictionary being not registered in the static dictionary; and associating a corresponding code and a dynamic code of the registered word in the dynamic dictionary, the corresponding code being associated with the registered word in the external dictionary, the dynamic code being associated with the registered word in the dynamic dictionary.

4. An encoding method that causes a computer to execute a process, the process comprising;

extracting a registered word from a plurality of first words registered in a dynamic dictionary when encoding a target file with a static dictionary and the dynamic dictionary, the registered word being included in an external dictionary and registered in the dynamic dictionary, the external dictionary associating respective word in a specific word group and respective code in a code group, the plurality of first words in the dynamic dictionary being not registered in the static dictionary using a processor; and associating a corresponding code and a dynamic code of the registered word in the dynamic dictionary, the corresponding code being associated with the registered word in the external dictionary, the dynamic code being associated with the registered word in the dynamic dictionary using the processor.

\* \* \* \* \*